United States Patent [19]
Lardinais et al.

[11] Patent Number: 5,609,376
[45] Date of Patent: Mar. 11, 1997

[54] WAFER CARRIER HANDLE ASSEMBLY

[75] Inventors: Robert J. Lardinais, Boise; Leo L. Malmin, Nampa, both of Id.

[73] Assignee: Micron Technology, Inc., Boise, Id.

[21] Appl. No.: 525,402

[22] Filed: Sep. 8, 1995

[51] Int. Cl.⁶ .................................................. B65D 25/28
[52] U.S. Cl. ........................................ 294/27.1; 294/165
[58] Field of Search .......................... 294/27.1, 31.1, 294/33, 15, 16, 87.1, 90, 143, 145, 165; 16/114 R; 206/454, 710, 711; 211/41; 220/752, 759, 762, 768, 769; 118/500, 503, 728

[56] References Cited

U.S. PATENT DOCUMENTS

| | | | |
|---|---|---|---|
| 3,640,398 | 2/1972 | Loxley et al. | 211/41 |
| 3,678,893 | 7/1972 | Bell, III | 118/500 |
| 3,861,733 | 1/1975 | Mey | 294/33 |
| 3,939,973 | 2/1976 | Wallestad | 294/27.1 X |
| 4,176,751 | 12/1979 | Gillissie | 211/41 |
| 4,244,673 | 1/1981 | Henderson | 414/405 |
| 4,515,104 | 5/1985 | Lee | 118/500 |
| 4,572,101 | 2/1986 | Lee | 118/500 |
| 4,595,222 | 6/1986 | Schumacher | 294/16 |
| 4,993,559 | 2/1991 | Cota | 211/41 |
| 5,029,922 | 7/1991 | DiNapoli et al. | 294/27.1 |
| 5,033,406 | 7/1991 | Lee | 118/500 |
| 5,054,834 | 10/1991 | Alessandri et al. | 294/87.1 |
| 5,110,001 | 5/1992 | Dunn | 220/94 |
| 5,123,804 | 6/1992 | Ishii et al. | 414/680 |
| 5,236,295 | 8/1993 | Ishii et al. | 414/222 |
| 5,316,472 | 5/1994 | Niino et al. | 432/241 |
| 5,356,261 | 10/1994 | Nishi | 414/744.7 |
| 5,364,144 | 11/1994 | Satterfield et al. | 294/27.1 |
| 5,383,783 | 1/1995 | Ishimori | 432/253 |
| 5,390,972 | 2/1995 | Galloway | 294/27.1 |

*Primary Examiner*—Johnny D. Cherry
*Attorney, Agent, or Firm*—Kirkpatrick & Lockhart LLP

[57] ABSTRACT

A wafer carrier handle assembly is disclosed that includes a handle and a pair of attachment rails, wherein each of the rails has a groove therein for receipt of a flange of a wafer carrier. At least one support is attached to the handle and each of the rails to support the rails from the handle, and at least one latch is connected to one of the support and the rails. The latch is movable between an unlatched position wherein movement of the flanges of the wafer carrier within the grooves is unrestrained, and a latched position wherein such movement is restrained. A combination wafer carrier and detachable wafer carrier handle assembly is also disclosed.

14 Claims, 2 Drawing Sheets

WAFER CARRIER HANDLE ASSEMBLY

BACKGROUND OF THE INVENTION

1. Field of the Invention

The present invention relates to devices useful for lifting and carrying objects. More particularly, the present invention relates to detachable wafer carrier handle assemblies and combinations thereof with wafer carriers.

2. Description of the Invention's Background

In the production of semiconductor devices such as transistors, it is common to simultaneously produce a plurality of semiconductor elements on one substrate composed of a semiconductor material, such as monocrystalline silicon, and to then break the substrate into individual elements for mounting in suitable enclosures. Such semiconductor substrates, or wafers, are often processed at least partially in batches, such that a number of wafers will go through at least several processing steps at the same time. To enable relatively rapid transfer of the wafers from one processing step to the next with minimal contamination of the wafers by human contact, various wafer carriers are used to hold the wafers, generally in a vertically upright, horizontally spaced array.

Two types of wafer carriers are commonly used in the industry. A high temperature wafer carrier is typically used during high temperature processing steps, wherein the temperature is greater than about 200 degrees Celsius, and is often made from a plurality of quartz rods that form a "basket" or "rack" for supporting the wafers. A low-temperature wafer carrier is typically used during lower temperature processing steps, and is often made of such plastics as polytetrafluoroethylene (Teflon®) or polypropylene. A low-temperature wafer carrier is often formed as a "cassette", such that it generally includes a base having a plurality of slots or grooves therein to receive and hold a plurality of wafers vertically upright and spaced uniformly and horizontally from each other, and a pair of flanges on opposite sides of an upper portion of the base. The flanges generally provide a means whereby some form of a handling apparatus can attach to the wafer carrier to allow manipulation of the wafer carrier, such as removal of the wafer carrier from one processing step and movement to the next step.

Various handling apparatuses are known in the prior art. For example, various robotic handling apparatuses are known, such as those disclosed in U.S. Pat. Nos. 5,054,834, 5,110,01, 5,123,804, 5,236,295 and 5,356,261, for robotically manipulating a wafer carrier during or between processing steps. Such handling apparatuses have the disadvantage, however, that they are relatively expensive and thus tend to be used most often in situations where human intervention is unacceptable or undesirable, such as in high temperature situations or in situations where the risk of contamination from human intervention is too high.

Other types of handles are known, such as those disclosed in U.S. Pat. Nos. 4,515,104, 4,572,101 and 5,033,406, that are specifically adapted to enable lifting and movement of "rack"- or "basket"-shaped wafer carriers of the type often used during high temperature processing steps. Such handles are often designed to lift a wafer carrier from the end or side of the carrier, and thus tend to have the disadvantage that they are relatively unstable, which can increase the chance that a user will accidentally drop one or more wafers off of the carrier during use of the handle.

Yet other types of prior art handles are known, such as the handle disclosed in FIG. 1 of U.S. Pat. No. 5,364,144 and the handle disclosed in FIG. 1 of this application, that are more specifically adapted for use with the "cassette" style of wafer carrier more often used in lower temperature processing steps.

Such handles can include an attachment piece, such as the hooks 12 of FIG. 1 of the '144 patent or the attachment piece 1 of FIG. 1 of the instant application, for sliding around the flanges of the wafer carrier until the attachment piece abuts stops below the flanges, and a handle piece, such as the ring 11 of FIG. 1 of the '144 patent or the handle 2 of FIG. 1 of the instant application, to enable lifting of the wafer carrier.

Such handles generally thus are intended to support a wafer carrier through contact of the attachment piece with the flanges and the stops at one end of the wafer carrier, such that the counterbalancing weight of wafers in the opposite end of the carrier restrains the attachment piece from sliding away from the stops and off of the flanges. However, it is common to make such handles out of the same materials as the carrier, i.e., Teflon® or polypropylene, and as a result there is normally a very low coefficient of friction between the attachment piece and the flanges. Such handles thus normally slide off of a wafer carrier relatively easily, especially when there are only a small number of wafers in the carrier and thus a low counterbalancing weight, or when a handle is left on a carrier during a processing step that involves agitation, such as agitation of a fluid in which the carrier is immersed.

In view of the above, it is an object of the present invention to provide an improved wafer carrier handle assembly that is readily capable of detachable attachment to a wafer carrier.

It is another object of the present invention to provide an improved combination wafer carrier and detachable wafer carrier handle assembly.

A further object of the present invention is to provide a wafer carrier handle assembly and a combination wafer carrier and wafer carrier handle assembly that are relatively inexpensive.

It is a further object of the present invention to provide a wafer carrier handle assembly that is useful for handling wafer carriers designed for relatively lower-temperature processing steps.

Yet another object of the present invention is to provide a wafer carrier handle assembly that restrains sliding movement of a wafer carrier relative to the wafer carrier handle assembly.

Another object of the present invention is to provide a wafer carrier handle assembly and a combination wafer carrier and wafer carrier handle assembly that are relatively easy to use.

SUMMARY OF THE INVENTION

The above objects as well as other objects not specifically enumerated are accomplished by a wafer carrier handle assembly in accordance with the present invention. The wafer carrier handle assembly of the present invention includes a handle and a pair of attachment rails, wherein each of the rails has a groove therein for receipt of a flange of a wafer carrier. At least one support is attached to the handle and each of the rails to support the rails from the handle, and at least one latch is connected to one of the support and the rails. The latch is movable between an unlatched position wherein movement of the flanges of the wafer carrier within the grooves is unrestrained, and a latched position wherein such movement is restrained.

The objects of the invention are also accomplished by a combination wafer carrier and detachable wafer carrier handle assembly. The wafer carrier includes a base for supporting a plurality of semiconductor wafers and a pair of flanges attached to the base, wherein each of the flanges includes a notch handle and a pair of attachment rails, wherein each of the rails therein. The detachable wafer carrier handle assembly includes a has a groove therein and each of the flanges of the wafer carrier extends at least partially within one of the grooves. The detachable wafer carrier handle assembly further includes at least one support attached to the handle and each of the rails to support the rails from the handle, and at least one latch connected to one of the support and the rails. The latch is movable between an unlatched position wherein movement of the flanges within the grooves is unrestrained, and a latched position wherein such movement is restrained.

BRIEF DESCRIPTION OF THE DRAWINGS

The preferred embodiment of the present invention will be described in greater detail with reference to the accompanying drawings, wherein like members bear like reference numerals and wherein.

DETAILED DESCRIPTION OF THE PREFERRED EMBODIMENT

Figure 1:
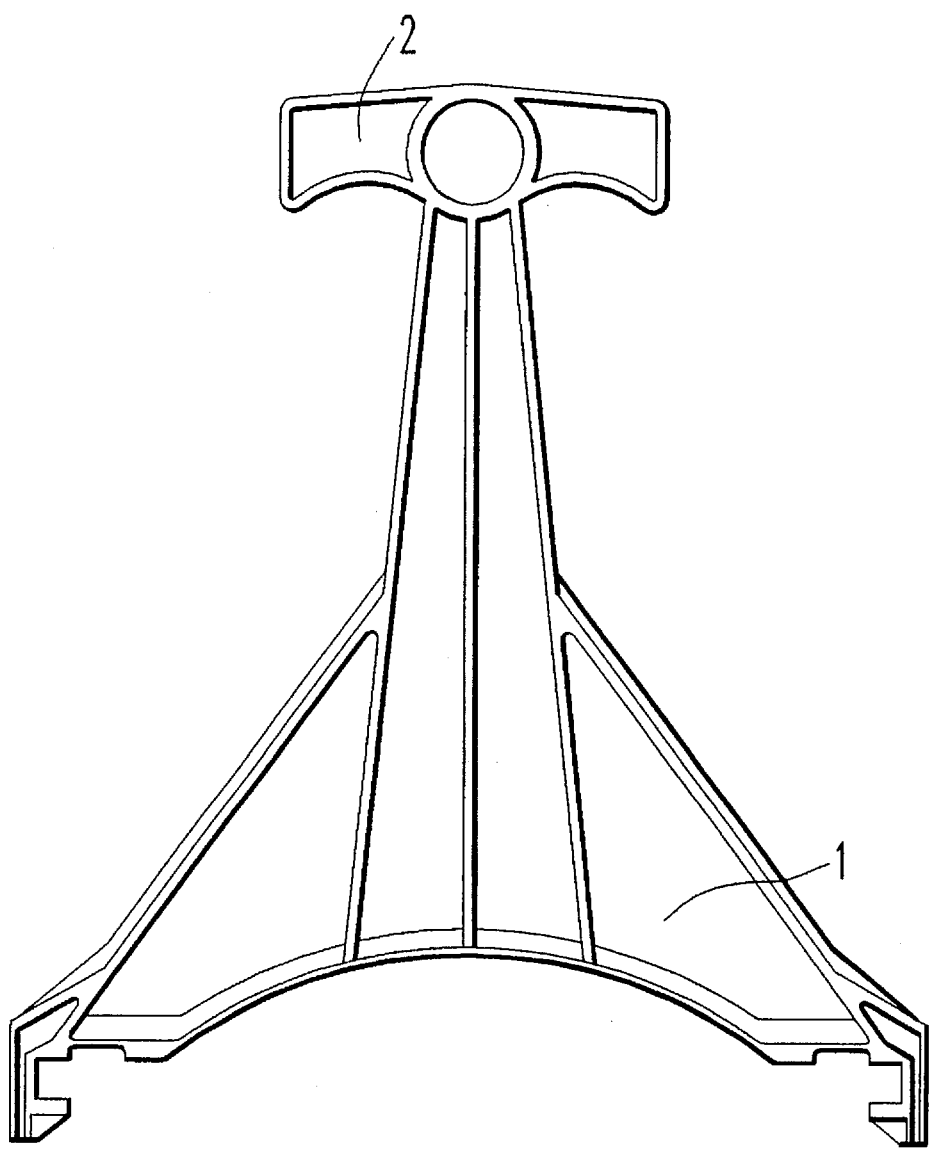
FIG. 1 is a front elevational view of a prior art wafer carrier handle.
Figure 2:
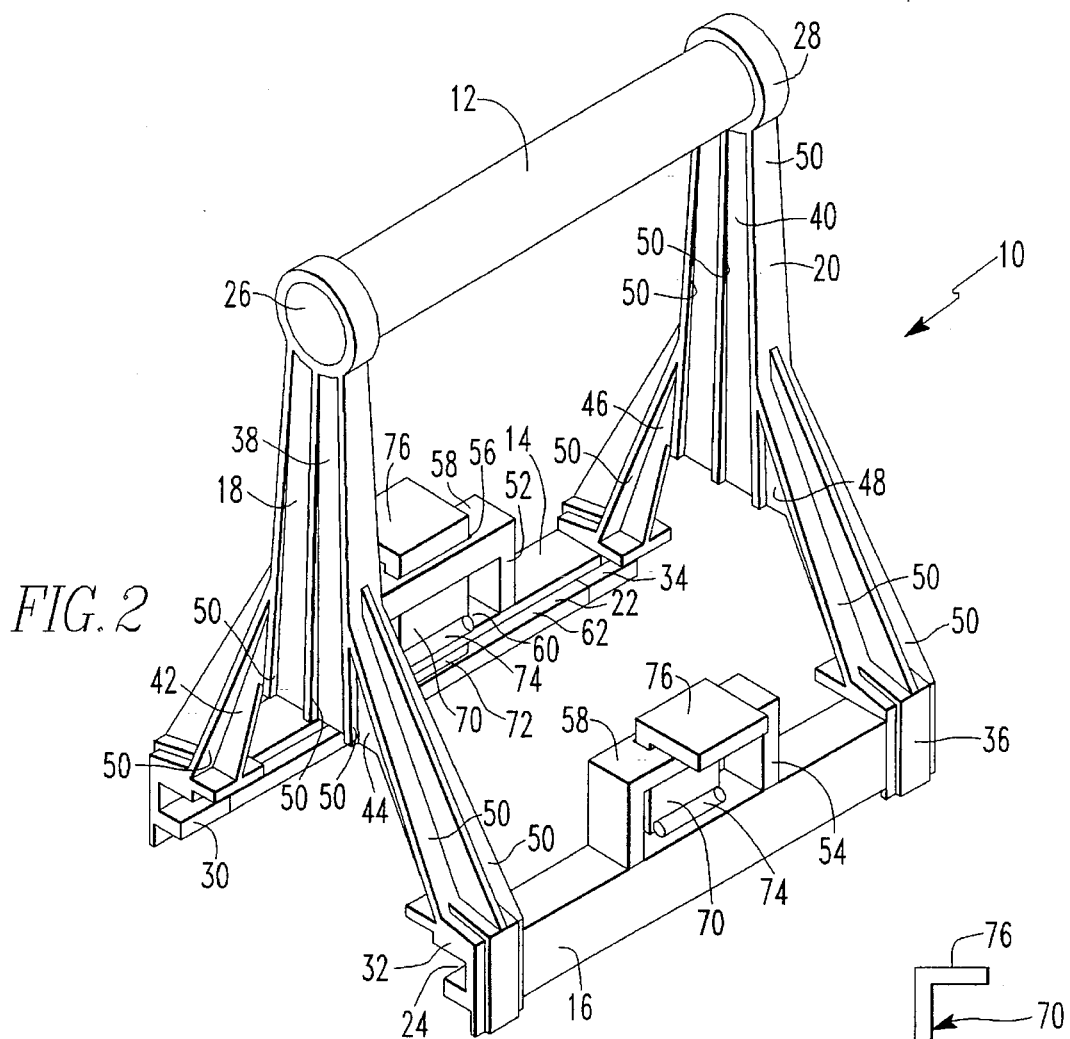
FIG. 2 is a perspective view of a wafer carrier handle assembly of the present invention.
Figure 3:
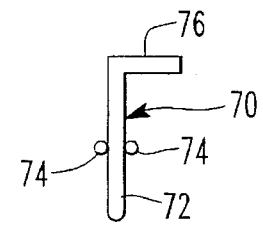
FIG. 3 is a side elevational view of a latch of the wafer carrier handle assembly of FIG. 1.
Figure 4:
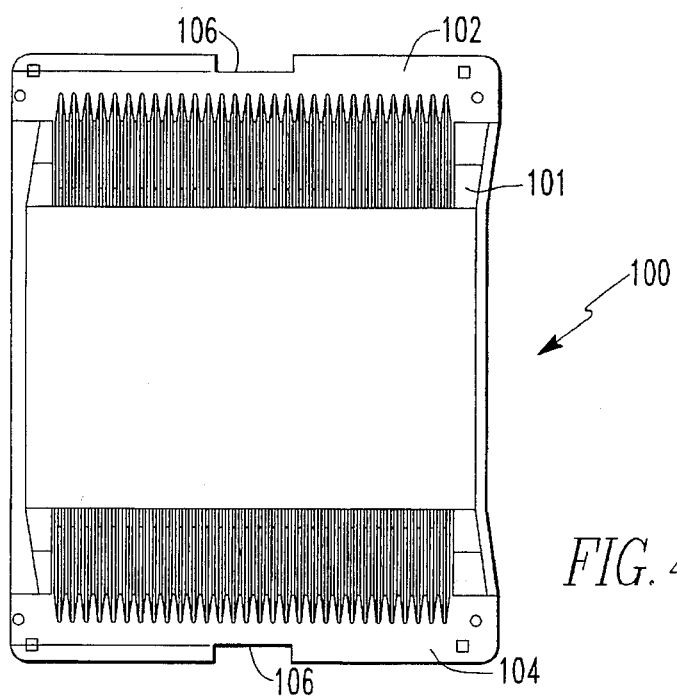
FIG. 4 is a top plan view of a wafer carrier of the present invention.

With reference to FIGS. 2–4, a wafer carrier handle assembly 10 in accordance with an embodiment of the present invention includes a handle 12, a pair of attachment rails 14, 16, and a pair of supports 18, 20. The handle 12 is preferably a hollow cylindrical tube, although it may be formed as a solid cylinder if desired. The rails 14, 16 are preferably U-shaped, such that a groove 22, 24 extends horizontally through each rail 14, 16, respectively, for receipt of a flange 102, 104, respectively, of a wafer carrier 100 shown in FIG. 4, as will be discussed in greater detail hereinbelow.

Each of the supports 18, 20 is attached to the handle 12 at opposite ends of the handle 12 by means of handle end caps 26, 28 that extend over the ends of the handle 12. Each of the supports 18, 20 is also attached to each of the rails 14, 16 at opposite ends of the rails 14, 16, respectively, by means of rail end caps 30, 32, 34, 36 that extend over the ends of the rails 14, 16, to support the rails 14, 16 from the handle 12. Each support 18, 20 includes a main support piece 38, 40, respectively, and a pair of struts 42, 44 and 46, 48, respectively, attached between the main support pieces 38, 40 and the rail end caps 30, 32, 34, 36. The handle end caps 26, 28 preferably are welded to the handle 12, and the rail end caps 30, 32, 34, 36 are preferably welded to the rails 14, 16, respectively.

Each of the handle 12, the rails 14, 16, and the supports 18, 20 is preferably formed of a plastic material, such as polytetrafluoroethylene (Teflon®) or polypropylene, which each has relatively high strength and rigidity, and is substantially nonreactive with the chemicals involved in the semiconductor production process, at the relatively lower temperatures of below 200 degrees Celsius. To increase the rigidity of the supports 18, 20, the main support pieces 38, 40 and the struts 42, 44, 46, 48 are provided with a plurality of ribs 50 running therealong. At higher processing temperatures, i.e., around 165 degrees Celsius, it has been found to be preferable to form the main support pieces 38, 40 and the struts 42, 44, 46, 48 as solid pieces to increase their rigidity, such that the interstices between the various ribs 50 are filled and the ribs 50 no longer extend outwardly from the main support pieces 38, 40 or the struts 42, 44, 46, 48.

Each rail 14, 16 has attached thereto in the center thereof, such as by welding, a U-shaped latch guide 52, 54, respectively. Each latch guide 52, 54 has a slot 56 in the upper leg 58 thereof, which slot 56 extends directly above similarly-shaped slots in the upper and lower legs of each rail 14, 16, respectively, such as the upper and lower legs 60, 62 of the rail 14. A latch 70 extends through each of the slots 56 and the slots in the rails 14, 16. As shown in FIGS. 2 and 3, each latch 70 includes a latch portion 72, first stops 74, and an operator 76 that also acts as a second stop, as will be described in more detail hereinbelow. The latch guides 52, 54 and the latches 70 are preferably formed of a plastic material, such as polytetrafluoroethylene (Teflon®) or polypropylene.

As shown in FIG. 4, a wafer carrier 100 in accordance with the present invention includes a base 101 and a pair of flanges 102, 104 extending from the base 101. Each flange 102, 104 includes a notch 106 in the center thereof. The wafer carrier 100 is preferably formed of a plastic material, such as polytetrafluoroethylene (Teflon®) or polypropylene.

With reference to FIGS. 2–4, the structure and operation of the wafer carrier handle assembly 10 and the wafer carrier 100 will now be explained. The wafer carrier 100 would in normal use have one or more wafers loaded into the wafer carrier 100 vertically upright and spaced from each other horizontally. If a processing line worker desired to move the loaded wafer carrier 100 into, out of or between processing steps, he or she would grasp the operators 76 of each latch 70 and move the handle assembly 10 to a position where the ends of the grooves 22, 24 in the rails 14, 16 would be adjacent ends of the flanges 102, 104 of the wafer carrier 100.

At this point the latches 70 would be in an unlatched position, wherein the latches 70 are slid vertically upward relative to the rails 14, 16 and the latch guides 52, 54 until the first stops 74 contact the underside of the upper legs 58 of the latch guides 52, 54. The latch portions 72 of the latches 70 would be substantially removed from the grooves 22, 24 in the rails 14, 16.

The worker would then slide the handle assembly 10 onto the wafer carrier 100, such that the flanges 102, 104 would be received within the grooves 22, 24. At this point the slots 56 and the slots in the rails 14, 16 would be aligned with the notches 106 in the flanges 102, 104. The worker thus would release the operators 76 and allow the latches 70 to slide vertically downward relative to the latch guides 52, 54, the rails 14, 16 and the flanges 102, 104 until the operators 76 contacted the upper legs 58 of the latch guides 52, 54 and acted to stop further downward movement. In a latched position, the latch portions 72, 74 of the latches 70 extend at least partially into the grooves 22, 24 and at least partially into the notches 106, and preferably extend fully through the grooves 22, 24 and the notches 106 and into the slots in the lower legs of the rails 14, 16.

In the latched position, movement of the flanges 102, 104 within the grooves 22, 24, which as used herein means movement in a direction substantially parallel to a line drawn down the center of each groove 22, 24, is restrained. Accordingly, the worker can lift the handle assembly 10 and the wafer carrier 100 by the handle 12 and carry them as needed without fear that the flanges 102, 104 will slide out of the grooves 22, 24. In addition, the worker can be assured that the handle assembly 10 will remain on the wafer carrier 100 during processing steps that involve agitation, such as agitation of a fluid in which the wafer carrier 100 is immersed. When the worker decides to remove the handle assembly 10 from the wafer carrier 100, he or she needs only to lift the operators 76 until the latches 70 are in the unlatched position, and then slide the handle assembly 10 off of the wafer carrier 100.

The advantages of the wafer carrier handle assembly 10 and the wafer carrier 100 of the present invention can readily be seen. In part because the handle assembly 10 includes two rails 14, 16 that contact and support a substantial portion of the flanges 102, 104 of the wafer carrier 100, and two spaced supports 18, 20 that attach the handle 12 to the rails 14, 16, the combination of the handle assembly 10 and the wafer carrier 100 is very stable when being carried. This stability makes it possible for a processing line worker to easily carry the combination with one hand without undue fear of spilling the wafers. In addition, in part because the latches 70 restrain movement of the flanges 102, 104 within the grooves 22, 24 when the latches 70 are in the latched position, the incidence of accidental sliding of the wafer carrier 100 out from the handle assembly 10 during lifting and carrying of the combination, and of the handle assembly 10 off of the wafer carrier 100 during processing steps involving agitation, is reduced. In addition, the handle assembly 10 and the combination handle assembly 10 and wafer carrier 100 are relatively inexpensive and relatively easy to use.

It is to be understood that, while not shown in the drawings, it is within the scope of the invention to include stops on one end of each rail, such that the handle assembly may only be slid onto and off of the wafer carrier in one direction and such that the flanges abut the stops when the handle assembly is fully slid onto the wafer carrier. Such a modification has been found to be advantageous for handle assemblies used in processing steps involving both agitation and relatively higher temperatures, such as steps involving temperatures of about 165 degrees Celsius, to further stabilize the handle assembly and the wafer carrier relative to each other.

The principles, a preferred embodiment and the mode of operation of the present invention have been described in the foregoing specification. However, the invention which is intended to be protected is not to be construed as limited to the particular embodiment disclosed. The embodiment is therefore to be regarded as illustrative rather than restrictive. Variations and changes may be made by others without departing from the spirit of the present invention. Accordingly, it is expressly intended that all such equivalents, variations and changes which fall within the spirit and scope of the present invention as defined in the claims be embraced thereby.

What is claimed is:

1. A wafer carrier handle assembly, comprising:
   a handle;
   a pair of attachment rails, each of said rails having a groove therein for receipt of a flange of a wafer carrier;
   at least one support attached to said handle and each of said rails to support said rails from said handle; and
   at least one latch connected to one of said support and said rails, said latch being movable between an unlatched position wherein movement of the flanges of the wafer carrier within said grooves is unrestrained, and a latched position wherein such movement is restrained.

2. A wafer carrier handle assembly as claimed in claim 1, wherein said latch is connected to one of said rails, said latch extending at least partially into said groove of said rail when said latch is in said latched position.

3. A wafer carrier handle assembly as claimed in claim 1, wherein said assembly includes a latch connected to each rail, each of said latches extending at least partially into the corresponding groove of each rail when said latches are in said latched position.

4. A wafer carrier handle assembly as claimed in claim 1, wherein said latch is slidingly connected to one of said rails.

5. A wafer carrier handle assembly as claimed in claim 4, wherein said grooves extend horizontally through said rails, and said latch is slidable vertically between said unlatched position, wherein said latch is substantially removed from the groove in said one rail, and said latched position, wherein said latch extends into said groove in said one rail.

6. A wafer carrier handle assembly as claimed in claim 1, wherein said latch includes a pair of stops for restraining movement of said latch substantially past said latched and unlatched positions.

7. A wafer carrier handle assembly as claimed in claim 1, wherein said assembly includes two supports and wherein each of said supports is attached to said handle and to each of said rails.

8. A combination wafer carrier and detachable wafer carrier handle assembly, comprising:
   a wafer carrier, said wafer carrier including
      a base for supporting a plurality of semiconductor wafers, and
      a pair of flanges attached to said base, each of said flanges including a notch therein; and
   a detachable wafer carrier handle assembly, said handle assembly including
      a handle,
      a pair of attachment rails, each of said rails having a groove therein, each of said flanges of said wafer carrier extending at least partially within one of said grooves,
      at least one support attached to said handle and each of said rails to support said rails from said handle, and
      at least one latch connected to one of said support and said rails, said latch being movable between an unlatched position wherein movement of said flanges within said grooves is unrestrained, and a latched position wherein such movement is restrained.

9. A combination as claimed in claim 8, wherein said latch is connected to one of said rails, said latch extending at least partially into one of said notches when said latch is in said latched position.

10. A combination as claimed in claim 8, wherein said detachable wafer carrier handle assembly includes a latch connected to each rail, each of said latches extending at least partially into one of said notches when said latches are in said latched position.

11. A combination as claimed in claim 8, wherein said latch is slidingly connected to one of said rails.

12. A combination as claimed in claim 11, wherein said grooves extend horizontally through said rails, and said latch is slidable vertically between said unlatched position, wherein said latch is substantially removed from the groove in said one rail, and said latched position, wherein said latch extends into the notch in the flange extending into said groove in said one rail.

13. A combination as claimed in claim 8, wherein said latch includes a pair of stops for restraining movement of said latch substantially past said latched and unlatched positions.

14. A combination as claimed in claim 8, wherein said detachable wafer carrier handle assembly includes two supports and wherein each of said supports is attached to said handle and to each of said rails.

* * * * *